United States Patent
Bae et al.

(10) Patent No.: US 8,980,536 B2
(45) Date of Patent: Mar. 17, 2015

(54) DEVELOPER COMPOSITIONS AND METHODS OF FORMING PHOTOLITHOGRAPHIC PATTERNS

(75) Inventors: Young Cheol Bae, Weston, MA (US); Seung-Hyun Lee, Marlborough, MA (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 0 days.

(21) Appl. No.: 13/407,467

(22) Filed: Feb. 28, 2012

(65) Prior Publication Data

US 2012/0219755 A1    Aug. 30, 2012

Related U.S. Application Data

(60) Provisional application No. 61/447,675, filed on Feb. 28, 2011.

(51) Int. Cl.
G03F 7/26 (2006.01)
G03F 7/32 (2006.01)
G03F 7/09 (2006.01)
G03F 7/20 (2006.01)

(52) U.S. Cl.
CPC ............... *G03F 7/325* (2013.01); *G03F 7/094* (2013.01); *G03F 7/2041* (2013.01)
USPC .......................................................... 430/325

(58) Field of Classification Search
USPC .................. 430/322, 323, 325, 331
See application file for complete search history.

(56) References Cited

U.S. PATENT DOCUMENTS

| | | | |
|---|---|---|---|
| 5,294,263 A * | 3/1994 | Riso ................................ 134/40 |
| 5,326,840 A | 7/1994 | Przybilla et al. |
| 6,770,420 B2 | 8/2004 | Dietliker et al. |
| 6,790,579 B1 | 9/2004 | Goodall et al. |
| 7,649,432 B2 | 1/2010 | Sherrer et al. |
| 2003/0091940 A1* | 5/2003 | Nakao ............................ 430/322 |
| 2008/0318171 A1* | 12/2008 | Tsubaki ........................ 430/326 |
| 2009/0042147 A1 | 2/2009 | Tsubaki |
| 2009/0092932 A1* | 4/2009 | Hagiwara ..................... 430/323 |
| 2011/0159253 A1 | 6/2011 | Kang |
| 2011/0294069 A1 | 12/2011 | Bae et al. |

FOREIGN PATENT DOCUMENTS

| CN | 101266931 A | 9/2008 |
|---|---|---|
| EP | 0 064 222 A2 | 11/1982 |
| JP | 57173832 | 10/1982 |
| JP | 57173833 | 10/1982 |

(Continued)

OTHER PUBLICATIONS

Musafumi Asano, "Sub-100nm Lithography with KrF Exposure Using Multiple Development Method", Jpn. J. Appl. Phys., 1999, pp. 6999-7003, vol. 38.

(Continued)

*Primary Examiner* — Brittany Raymond
(74) *Attorney, Agent, or Firm* — Jonathan D. Baskin

(57) ABSTRACT

Provided are photoresist developer compositions that include a mixture of organic solvents. Also provided are methods of forming photolithographic patterns using negative tone development, coated substrates and electronic devices formed by the methods. The methods find particular applicability in the manufacture of electronic devices.

5 Claims, 3 Drawing Sheets

(56) References Cited

FOREIGN PATENT DOCUMENTS

| | | |
|---|---|---|
| JP | 2000199953 A | 7/2000 |
| JP | 2008-072059 A | 3/2008 |
| JP | 2008153373 A | 7/2008 |
| WO | 2010061977 A2 | 6/2010 |
| WO | WO 2010/140709 A1 | 12/2010 |
| WO | WO 2010/147228 A1 | 12/2010 |

OTHER PUBLICATIONS

V. Truffert, et al, "Ultimate Contact Hole Resolution Using Immersion Lithography With Line/Space Imaging", Proc. Of SPIE, Optical Microlithography XXII, 2009, pp. 72740N-1 thru 12, vo. 7274.

Shinji Tarutani, et al, "Development of materials and processes for negative tone development toward 32-nm node 193-nm immersion double-patterning process", Advanced in Resist Materials and Processing Technology Prof. Of SPIE, 2009, pp. 72730C-1 thru 8, vol. 7273.

* cited by examiner

DEVELOPER COMPOSITIONS AND METHODS OF FORMING PHOTOLITHOGRAPHIC PATTERNS

FIELD

The invention relates generally to the manufacture of electronic devices. More specifically, this invention relates to mixed organic developer solutions containing two or more organic developer solvents and to photolithographic processes utilizing such developer solutions. The invention finds particular use in semiconductor device manufacturing in negative tone development processes and allows for the formation of fine patterns.

BACKGROUND

In the semiconductor manufacturing industry, photoresist materials are used for transferring an image to one or more underlying layers, such as metal, semiconductor and dielectric layers, disposed on a semiconductor substrate, as well as to the substrate itself. To increase the integration density of semiconductor devices and allow for the formation of structures having dimensions in the nanometer range, photoresists and photolithography processing tools having high-resolution capabilities have been and continue to be developed.

Positive-tone chemically amplified photoresists are conventionally used for high-resolution processing. Such resists typically employ a resin having acid-labile leaving groups and a photoacid generator. Exposure to actinic radiation causes the acid generator to form an acid which, during post-exposure baking, causes cleavage of the acid-labile groups in the resin. This creates a difference in solubility characteristics between exposed and unexposed regions of the resist in an aqueous alkaline developer solution. Exposed regions of the resist are soluble in the aqueous alkaline developer and are removed from the substrate surface, whereas unexposed regions, which are insoluble in the developer, remain after development to form a positive image.

One approach to achieving nm-scale feature sizes in semiconductor devices is the use of short wavelengths of light, for example, 193 nm or less, during exposure of chemically amplified photoresists. To further improve lithographic performance, immersion lithography tools have been developed to effectively increase the numerical aperture (NA) of the lens of the imaging device, for example, a scanner having a KrF or ArF light source. This is accomplished by use of a relatively high refractive index fluid (i.e., an immersion fluid) between the last surface of the imaging device and the upper surface of the semiconductor wafer. The immersion fluid allows a greater amount of light to be focused into the resist layer than would occur with an air or inert gas medium. When using water as the immersion fluid, the maximum numerical aperture can be increased, for example, from 1.2 to 1.35. With such an increase in numerical aperture, it is possible to achieve a 40 nm half-pitch resolution in a single exposure process, thus allowing for improved design shrink. This standard immersion lithography process, however, is generally not suitable for manufacture of devices requiring greater resolution, for example, for the 32 nm and 22 nm half-pitch nodes.

In an effort to achieve greater resolution and to extend capabilities of existing manufacturing tools, advanced patterning techniques such as various double patterning processes (also referred to as pitch splitting) have been proposed. Another advanced patterning technique for obtaining fine lithographic patterns involves negative tone development (NTD) of traditionally positive-type chemically amplified photoresist materials. In negative tone development, a negative image can be obtained from a traditionally positive-type resist by development with particular organic solvents. Such a process is described, for example, in U.S. Pat. No. 6,790,579 to Goodall et al. That document discloses a photoresist composition comprising an acid-generating initiator and a polycyclic polymer containing recurring acid labile pendant groups along the polymer backbone. The exposed areas can be selectively removed with an alkaline developer or, alternatively, the unexposed regions can be selectively removed by treatment with a suitable nonpolar solvent for negative tone development.

U.S. Application Publication No. 2009/0042147A1 to Tsubaki et al also discloses a negative tone development process. In the described process, a substrate is coated with a resist composition, a protective film containing a resin having a silicon or fluorine atom is formed on the resist composition, and the resist film is exposed via an immersion medium and developed with a negative developer. That document discloses various organic developers and developer mixtures. Among the developer materials described in the examples of this document, butyl acetate is commonly used. The present inventors have found that acceptable patterns can be imaged for larger feature sizes using n-butyl acetate as the developer. With reductions in feature sizes and increases in aspect ratios, however, it becomes difficult to obtain accurate resist patterns using this developer. For example, it has been found that when forming smaller contact holes, n-butyl acetate tends to result in missing contact holes with increased exposure energy. This tendency has been found to become exacerbated with resist formulations having higher molecular weight polymers that exhibit poor solubility in n-butyl acetate. It has further been found during studies for the present invention that other developer solvents such as 2-heptanone, while providing excellent imaging at greater resolutions, exhibit a relatively slow exposure window with significant thickness loss after development for memory applications.

There is a continuing need in the art for developer compositions and photolithographic patterning processes which address one or more of the problems associated with the state of the art and which allow for the formation of fine patterns in electronic device fabrication. It has been found that use of particular combinations of organic developers can provide for excellent lithographic performance in negative tone development processes. Quite surprisingly, it has been discovered that developer mixtures of the invention can exhibit positive attributes of while avoiding or minimizing negative characteristics of the individual developers.

SUMMARY

According to a first aspect of the invention, photoresist developer compositions are provided. The compositions comprise a mixture of a first organic solvent and a second organic solvent. The first organic solvent is chosen from cyclic $C_6$ ketones, linear or branched $C_7$ ketones, linear or branched $C_5$ to $C_6$ hydroxy alkyl esters and linear or branched $C_5$ to $C_6$ alkoxy alkyl esters. The second organic solvent is chosen from linear or branched unsubstituted $C_6$ to $C_8$ alkyl esters and linear or branched $C_8$ to $C_9$ ketones.

According to a further aspect of the invention, coated substrates are provided. The coated substrates comprise: a substrate comprising one or more layer to be patterned on a surface thereof; an exposed layer of a photoresist composition over the one or more layer to be patterned; and a photoresist developer composition as described herein in contact with the exposed photoresist composition layer.

According to a further aspect, methods of forming photolithographic patterns are provided. The methods comprise: (a) providing a substrate comprising one or more layer to be patterned over a surface of the substrate; (b) applying a layer of a photoresist composition over the one or more layer to be patterned; (c) patternwise exposing the photoresist composition layer to actinic radiation; (d) heating the exposed photoresist composition layer in a post-exposure bake process; and (e) applying a photoresist developer composition as described herein to the post-exposure baked photoresist composition layer to remove unexposed regions of the photoresist composition layer, thereby forming a photoresist pattern.

In accordance with a further aspect, provided are electronic devices which are formed by the methods described herein.

As used herein: "g" means grams; wt % means weight percent; "L" means liter; "mL" means milliliter; "nm" means nanometer; "mm" means millimeter; "min" means minute; "h" means hour; "Å" means Angstrom; "mol %" means mole percent; "ppb" means parts per billion; "Mw" means weight average molecular weight; and "Mn" means number average molecular weight; "PDI" means polydispersity index=Mw/Mn; and the articles "a" and "an" are inclusive of one or more.

BRIEF DESCRIPTION OF THE DRAWINGS

The present invention will be described with reference to the following drawings, in which like reference numerals denote like features, and in which.

DETAILED DESCRIPTION

Developer Compositions

Figure 1A:
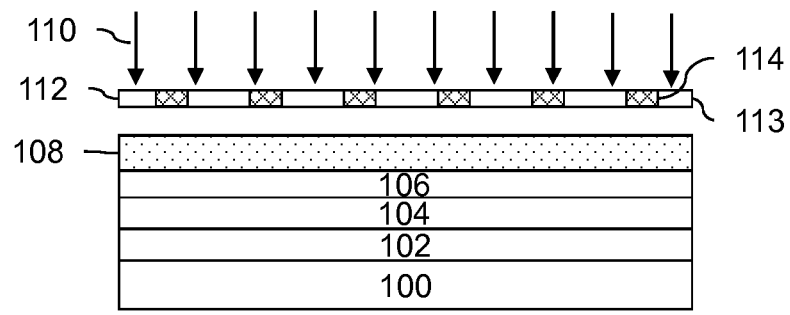
FIG. 1A-E illustrates a process flow for forming a photolithographic pattern in accordance with the invention.

The developer compositions of the invention include a first organic solvent and a second organic solvent chosen from various solvents described below. The solvent mixture can include one or more additional organic solvents as well as one or more other optional components.

The ideal developer for a negative tone development process would result in a resist thickness after exposure at low dose (e.g., 3 mJ/cm$^2$ or less) of close to zero and after exposure at higher dose (e.g., 33 mJ/cm$^2$ or more) of close to the original film thickness, taking into account thickness loss due to deprotection reaction. Depending on the size of a leaving group and the molar composition of a leaving group monomer in the resist polymer chain, a thickness loss due to deprotection of from 10 to 30% is typical after exposure at higher energy followed by post-exposure bake.

For purposes of evaluating materials for suitability in the NTD developer compositions of the invention, individual solvents can be classified into four categories (Types I-IV) corresponding to different development modes. FIG. 1 illustrates NTD contrast curves representative of the four development modes. Type I NTD behavior shows complete or near complete dissolution of exposed areas of a resist film under low exposure dose (e.g., less than 2% of the original resist film thickness) and very low film retention (e.g., less than 50% of the original resist film thickness) of exposed areas of a resist film under high exposure dose. As such, Type I materials are very good solvents for the resist material but exhibit extremely poor NTD contrast, making this class of solvents unsuitable by themselves for use as an NTD developer. Type II NTD behavior is characterized by a good NTD contrast with complete or near complete dissolution of exposed areas under low exposure dose and good film retention (e.g., 60% or more of the original resist film thickness) of exposed areas under high exposure dose. Type III NTD behavior exhibits a good NTD contrast with a very good film retention (e.g., 70% or more of the original resist film thickness) of exposed areas under high exposure dose but has a relatively large residual thickness (e.g., from 2 to 10% of the original resist film thickness) at lower exposure dose. Type IV NTD behavior is characterized by very poor NTD contrast, showing significant resist film retention (e.g., 40% or more of the original resist film thickness) at low exposure dose and near complete film retention (e.g., 80% or more of the original resist film thickness) at high exposure dose. Thickness loss is primarily due to the loss of leaving groups in the polymer chain from deprotection. Because of these properties, Type IV solvents by themselves are unsuitable for use as an NTD developer. The numerical ranges provided for the different modes are exemplary and will depend, for example, on the particular photoresist material and post exposure bake temperature.

Preferably, the first organic solvent is chosen from particular Type I or Type II solvents and the second organic solvent is chosen from particular Type III or Type IV solvents. It is believed that developer compositions that include such a combination of organic solvents allow for resist removal at lower exposure doses and good film retention at higher exposure doses, as well as tailoring of photospeed by control of the solvent to solvent ratio.

Suitable Type I organic solvents include, for example, cyclohexanone, 2-hexanone, methyl-2-hydroxyisobutyrate, ethyl lactate and propylene glycol monomethyl ether acetate (PGMEA). Suitable Type II organic solvents include, for example, ethyl acetate, n-propyl acetate, 2-heptanone and 5-methyl-2-hexanone (also Type III). Suitable Type III organic solvents include, for example, n-butyl acetate, 5-methyl-2-hexanone (also Type II) and 4-heptanone. Suitable Type IV organic solvents include, for example, n-pentyl acetate, n-butyl propionate, n-hexyl acetate, n-butyl butyrate, isobutyl butyrate, 2,5-dimethyl-4-hexanone and 2,6-dimethyl-4-heptanone.

The first organic solvent is chosen from: cyclic $C_6$ ketones such as cyclohexanone; linear or branched $C_7$ ketones such as 2-heptanone, 5-methyl-2-hexanone and 4-heptanone, preferably a terminal $C_7$ ketone such as 2-heptanone and 5-methyl-2-hexanone; linear or branched $C_5$ to $C_6$ hydroxy alkyl esters such as methyl-2-hydroxyisobutyrate and ethyl lactate; and linear or branched $C_5$ to $C_6$ alkoxy alkyl acetates such as propylene glycol monomethyl ether acetate (PGMEA). Of these, 2-heptanone and 5-methyl-2-hexanone are particularly preferred for use as the first organic solvent. The second organic solvent is chosen from linear or branched unsubstituted $C_6$ to $C_8$ alkyl esters such as n-butyl acetate, n-pentyl acetate, n-butyl propionate, n-hexyl acetate, n-butyl butyrate and isobutyl butyrate; and linear or branched $C_8$ to $C_9$ ketones such as 2,5-dimethyl-4-hexanone and 2,6-dimethyl-4-heptanone. Of the second organic solvents, n-butyl acetate, n-butyl propionate and 2,6-dimethyl-4-heptanone are preferred.

Preferred combinations of the first and second organic solvent include 2-heptanone/n-butyl propionate, cyclohexanone/n-butyl propionate, PGMEA/n-butyl propionate, 5-methyl-2-hexanone/n-butyl propionate, 2-heptanone/2,6- dimethyl-4-heptanone and 2-heptanone/n-butyl acetate. Of these, 2-heptanone/n-butyl acetate and 2-heptanone/n-butyl propionate are particularly preferred.

Optionally, the organic solvent mixture can include one or more additional organic solvents such as those described above with respect to the first and second organic solvents, or a solvent used in the photoresist composition. While preferred developer compositions include a binary organic solvent component, ternary, quaternary or higher order organic solvent mixtures may be desired to fine tune development characteristics.

The first and second and optional additional organic solvents are each typically present in the developer composition in an amount of from 10 to 90 wt %, more typically from 30 to 70 wt %, based on the total developer composition. In a binary organic solvent mixture, the first organic solvent is typically present in the composition in an amount of from 30 to 70 wt % based on the total developer composition, and the second organic developer is present in the composition in an amount of from 70 to 30 wt % based on the total developer composition.

The content of each developer should be tuned for optimum performance with the particular photoresist material for the particular pattern being formed in a way that provides an acceptable exposure process window for formation of an acceptable resist pattern. The first, second and optional additional organic solvents are typically present in the developer in a combined amount of from 90 wt % to 100 wt %, more typically greater than 95 wt %, greater than 98 wt %, greater than 99 wt % or 100 wt %, based on the total weight of the developer.

The developer material may include optional additives such as a surfactant. Typical surfactants include those which exhibit an amphiphilic nature, meaning that they can be both hydrophilic and hydrophobic at the same time. Amphiphilic surfactants possess a hydrophilic head group or groups, which have a strong affinity for water and a long hydrophobic tail, which is organophilic and repels water. Suitable surfactants can be ionic (i.e., anionic, cationic) or nonionic. Further examples of surfactants include silicone surfactants, poly (alkylene oxide) surfactants, and fluorochemical surfactants. Suitable non-ionic surfactants include, but are not limited to, octyl and nonyl phenol ethoxylates such as TRITON® X-114, X-100, X-45, X-15 and branched secondary alcohol ethoxylates such as TERGITOL™ TMN-6 (The Dow Chemical Company, Midland, Mich. USA). Still further exemplary surfactants include alcohol (primary and secondary) ethoxylates, amine ethoxylates, glucosides, glucamine, polyethylene glycols, poly(ethylene glycol-co-propylene glycol), or other surfactants disclosed in *McCutcheon's Emulsifiers and Detergents*, North American Edition for the Year 2000 published by Manufacturers Confectioners Publishing Co. of Glen Rock, N.J. Nonionic surfactants that are acetylenic diol derivatives also can be suitable. Such surfactants are commercially available from Air Products and Chemicals, Inc. of Allentown, Pa. and sold under the trade names of SURFYNOL® and DYNOL®. Additional suitable surfactants include other polymeric compounds such as the tri-block EO-PO-EO co-polymers PLURONIC® 25R2, L121, L123, L31, L81, L101 and P123 (BASF, Inc.). Such optional additives typically will be present in minor concentrations, for example, in amounts of from about 0.01 to 5 wt % based on the total weight of the developer.

The developer compositions of the invention can be prepared by combining the first, second and optional additional organic solvents, and other optional components in any order. The organic solvents should be of high purity, compatible with semiconductor processing so as not to adversely impact electronic device characteristics or reliability. Suitable high purity organic solvents are commercially available, for example, from Eastman Kodak Chemical Company (Kingsport, Tenn., USA). The trace metals content of the organic solvents is preferably less than 10 ppb, more preferably less than 1 ppb. Suitable purification techniques are known in the art and include, for example, ion exchange and filtration. Ion exchange can be used to remove trace metal ion levels of both the alkali earth and transition metals to extremely low levels. Suitable filtration techniques include, for example, contact with polyethylene membranes having openings of 10 nm, 5 nm, 3 nm or below and/or nylon membranes having openings of 20 nm, 10 nm, 5 nm or below.

Negative Tone Development Methods

The invention further provides methods for forming a photoresist relief image and producing an electronic device using developer compositions of the invention. The invention also provides novel articles of manufacture comprising substrates coated with a photoresist composition and treated with a developer composition of the invention. Processes in accordance with the invention will now be described with reference to FIG. 1A-E, which illustrates an exemplary process flow for forming a photolithographic pattern by negative tone development.

FIG. 1A depicts in cross-section a substrate 100 which may include various layers and features. The substrate can be of a material such as a semiconductor, such as silicon or a compound semiconductor (e.g., III-V or II-VI), glass, quartz, ceramic, copper and the like. Typically, the substrate is a semiconductor wafer, such as single crystal silicon or compound semiconductor wafer, and may have one or more layers and patterned features formed on a surface thereof. One or more layers to be patterned 102 may be provided over the substrate 100. Optionally, the underlying base substrate material itself may be patterned, for example, when it is desired to form trenches in the substrate material. In the case of patterning the base substrate material itself, the pattern shall be considered to be formed in a layer of the substrate.

The layers may include, for example, one or more conductive layers such as layers of aluminum, copper, molybdenum, tantalum, titanium, tungsten, alloys, nitrides or silicides of such metals, doped amorphous silicon or doped polysilicon, one or more dielectric layers such as layers of silicon oxide, silicon nitride, silicon oxynitride, or metal oxides, semiconductor layers, such as single-crystal silicon, and combinations thereof. The layers to be etched can be formed by various techniques, for example, chemical vapor deposition (CVD) such as plasma-enhanced CVD, low-pressure CVD or epitaxial growth, physical vapor deposition (PVD) such as sputtering or evaporation, or electroplating. The particular thickness of the one or more layers to be etched 102 will vary depending on the materials and particular devices being formed.

Depending on the particular layers to be etched, film thicknesses and photolithographic materials and process to be used, it may be desired to dispose over the layers 102 a hard mask layer 104 and/or a bottom antireflective coating (BARC) 106 over which a photoresist layer 108 is to be coated. Use of a hard mask layer 104 may be desired, for example, with very thin resist layers, where the layers to be etched require a significant etching depth, and/or where the particular etchant has poor resist selectivity. Where a hard mask layer is used, the resist patterns to be formed can be transferred to the hard mask layer which, in turn, can be used as a mask for etching the underlying layers 102. Suitable hard mask materials and formation methods are known in the art.

Typical materials include, for example, tungsten, titanium, titanium nitride, titanium oxide, zirconium oxide, aluminum oxide, aluminum oxynitride, hafnium oxide, amorphous carbon, silicon oxynitride and silicon nitride. The hard mask layer 104 can include a single layer or a plurality of layers of different materials. The hard mask layer can be formed, for example, by chemical or physical vapor deposition techniques.

A bottom antireflective coating 106 may be desirable where the substrate and/or underlying layers would otherwise reflect a significant amount of incident radiation during photoresist exposure such that the quality of the formed pattern would be adversely affected. Such coatings can improve depth-of-focus, exposure latitude, linewidth uniformity and CD control. Antireflective coatings are typically used where the resist is exposed to deep ultraviolet light (300 nm or less), for example, KrF excimer laser light (248 nm) or ArF excimer laser light (193 nm). The antireflective coating 106 can comprise a single layer or a plurality of different layers. Suitable antireflective materials and methods of formation are known in the art. Antireflective materials are commercially available, for example, those sold under the AR™ trademark by Rohm and Haas Electronic Materials LLC (Marlborough, Mass. USA), such as AR™ 40A and AR™ 124 antireflectant materials.

A photoresist composition is applied on the substrate over the antireflective layer 106 (if present) to form a photoresist layer 108. The photoresist composition comprises a resin comprising an acid cleavable group and a photoacid generator. The photoresist composition can be a typically positive-acting material when developed in an aqueous alkaline developer, but negative-acting when developed in particular organic developers. Alternatively, the photoresist can be negative-acting when developed in particular organic developers and show no positive tone development in an aqueous alkaline developer. Suitable photoresist materials are known in the art and include, for example, those based on (meth) acrylate, novolak and silicon chemistries.

Suitable resists are described, for example, in U.S. Application Publication Nos. US20090117489 A1, US20080193872 A1, US20060246373 A1, US20090117489 A1, US20090123869 A1 and U.S. Pat. No. 7,332,616. Suitable materials include chemically amplified photoresists which undergo a photoacid-promoted deprotection reaction of acid labile groups of one or more components of the composition. Suitable photoacid-labile groups of the photoresist resins include ester groups that contain a tertiary non-cyclic alkyl carbon (e.g., t-butyl) or a tertiary alicyclic carbon (e.g., methyladamantyl) covalently linked to the carboxyl oxygen of the ester. Acetal photoacid-labile groups, for example, those found on polymers formed from monomers containing sugar-based moieties such as (2,2-dimethyl-1,3-dioxolan-4-yl)methyl methacrylate, 5-(2,2-dimethyl-1,3-dioxolan-4-yl)-2,2-dimethyltetrahydrofuro[2,3-d][1,3]dioxol-6-yl methacrylate and (2,2,7,7-tetramethyltetrahydro-3aH-bis([1,3]dioxolo)[4,5-b:4',5'-d]pyran-5-yl)methyl methacrylate can also be used. The resin component is used in the composition in an amount sufficient to render unexposed regions developable in an organic developer solution. The resin component will typically comprise about 70 to about 97 wt % of total solids of the resist.

The photosensitive composition further includes a photosensitive component, typically a photoacid generator (PAG), employed in an amount sufficient to generate a latent image in a coating layer of the composition upon exposure to activating radiation. For example, the photoacid generator will suitably be present in an amount of from about 1 to 20 wt % of total solids of the resist. Suitable PAGs are known in the art of chemically amplified photoresists and include, for example: onium salts, for example, triphenyl sulfonium salts, nitrobenzyl derivatives, sulfonic acid esters, diazomethane derivatives, glyoxime derivatives, sulfonic acid ester derivatives of an N-hydroxyimide compound and halogen-containing triazine compounds.

The photoresist composition can further include an added base, particularly tetrabutylammonium hydroxide (TBAH), or tetrabutylammonium lactate, which can enhance resolution of a developed resist relief image. For resists imaged at 193 nm, a typical added base is a hindered amine such as diazabicyclo undecene or diazabicyclononene. The added base is suitably used in relatively small amounts, for example, about 0.03 to 5 wt % relative to the total solids.

The photoresist compositions further include a solvent chosen, for example, from: glycol ethers such as 2-methoxyethyl ether (diglyme), ethylene glycol monomethyl ether, and propylene glycol monomethyl ether; propylene glycol monomethyl ether acetate; lactates such as methyl lactate and ethyl lactate; propionates such as methyl propionate, ethyl propionate, ethyl ethoxy propionate and methyl-2-hydroxy isobutyrate; Cellosolve esters such as methyl Cellosolve acetate; aromatic hydrocarbons such as toluene and xylene; and ketones such as methylethyl ketone, cyclohexanone and 2-heptanone. A blend of solvents such as a blend of two, three or more of the solvents described above also are suitable. The solvent is typically present in the composition in an amount of from 90 to 99 wt %, more typically from 95 to 98 wt %, based on the total weight of the photoresist composition.

The photoresist may include additional optional materials known to those skilled in the art. For example, other optional additives include surfactants such as described above with respect to the developer compositions, anti-striation agents, plasticizers, speed enhancers, fillers and dyes. Such optional additives typically will be present in minor concentrations in a photoresist composition, for example, in amounts of from about 0.1 to 10 wt % based on the total weight of a resist's dry components.

Photoresists useful in the invention are generally prepared following known procedures. For example, a resist can be prepared as a coating composition by dissolving the components of the photoresist in a suitable solvent. Typically the solids content of the photoresist varies between about 2 and 25 wt % based on the total weight of the photoresist composition.

The photoresist composition is applied on the substrate over the antireflective layer 106 (if present) to form a photoresist layer 108. The photoresist composition can be applied to the substrate by spin-coating, dipping, roller-coating or other conventional coating technique. Of these, spin-coating is typical. For spin-coating, the solids content of the coating solution can be adjusted to provide a desired film thickness based upon the specific coating equipment utilized, the viscosity of the solution, the speed of the coating tool and the amount of time allowed for spinning. A typical thickness for the photoresist layer 108 is from about 500 to 3000 Å.

The photoresist layer can next be softbaked to minimize the solvent content in the layer, thereby forming a tack-free coating and improving adhesion of the layer to the substrate. The softbake can be conducted on a hotplate or in an oven, with a hotplate being typical. The softbake temperature and time will depend, for example, on the particular material of the photoresist and thickness. Typical softbakes are conducted at a temperature of from about 90 to 150° C., and a time of from about 30 to 90 seconds.

If the photoresist layer 108 is to be exposed with an immersion lithography tool, for example a 193 nm immersion scanner, a topcoat layer (not shown) can be disposed over the photoresist layer 108. Use of such a topcoat layer can act as a barrier between the immersion fluid and underlying photoresist layer. In this way, leaching of components of the photoresist composition into the immersion fluid, possibly resulting in contamination of the optical lens and change in the effective refractive index and transmission properties of the immersion fluid, can be minimized or avoided. Suitable topcoat compositions are commercially available, for example, OPTICOAT™ topcoat materials such as OC™ 2000 (Rohm and Haas Electronic Materials) and are otherwise known in the art, for example, those described in U.S. Patent Application Pub. Nos. 2006/0246373A1 and 2010/0183977A1. Such compositions can be applied over the photoresist layer by any suitable method such as described above with reference to the photoresist compositions, with spin coating being typical. The topcoat layer thickness is typically λ/4n (or an odd multiple thereof), wherein 2 is the wavelength of the exposure radiation and n is the refractive index of the topcoat layer. If a topcoat layer is present, the photoresist layer 108 can be softbaked after the topcoat layer composition has been applied rather than prior to topcoat application. In this way, the solvent from both layers can be removed in a single thermal treatment step.

The photoresist layer 108 is next exposed to activating radiation 110 through a first photomask 112 to create a difference in solubility between exposed and unexposed regions. The photomask has optically transparent and optically opaque regions 113, 114 corresponding to regions of the photosensitive layer to remain and be removed, respectively, in a subsequent development step. The exposure energy is typically from about 20 to 80 mJ/cm$^2$, dependent upon the exposure tool and the components of the photosensitive composition. References herein to exposing a photoresist composition to radiation that is activating for the composition indicates that the radiation is capable of forming a latent image in the photoresist composition. The photosensitive compositions are typically photoactivated by a short exposure wavelength, particularly a sub-400 nm, sub-300 or sub-200 nm exposure wavelength, with I-line (365 nm), 248 nm and 193 nm being typical exposure wavelengths, as well as EUV (13.5 nm) and 157 nm.

Figure 1B:
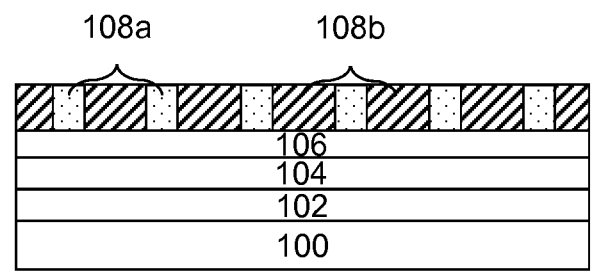

As shown in FIG. 1B, the exposed resist layer is made up of unexposed and exposed regions 108a, 108b. Following exposure of the photoresist layer 108, a post-exposure bake (PEB) is performed. The PEB can be conducted, for example, on a hotplate or in an oven. Conditions for the PEB will depend, for example, on the particular photoresist composition and layer thickness. The PEB is typically conducted at a temperature of from about 80 to 150° C., and a time of from about 30 to 90 seconds.

Figure 1C:
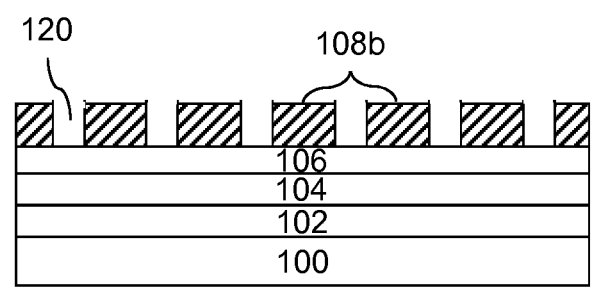

The exposed photoresist layer is next developed with a multi-solvent developer composition of the invention as described herein to remove unexposed regions 108a, leaving exposed regions 108b forming a resist pattern as shown in FIG. 1C. The developer can be applied to the substrate by known techniques, for example, by spin-coating, puddle-coating or a combination thereof. The development time is for a period effective to remove the unexposed regions of the photoresist, with a time of from 5 to 30 seconds being typical. Development is typically conducted at room temperature. The development process is typically conducted without use of a cleaning rinse following development. It may, however, be desirable to us a post-development rinse using, for example, a hydroxyl-containing solvent such as 1-hexanol.

Figure 1D:
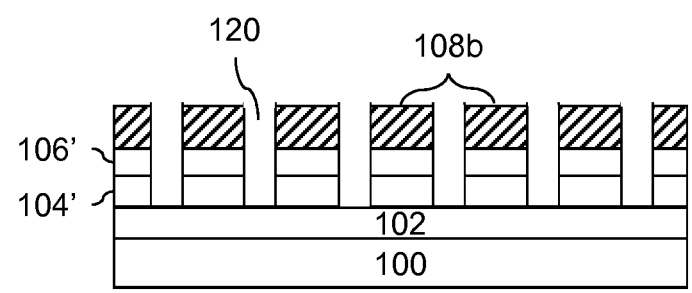

The BARC layer 106, if present, is selectively etched using resist pattern 108b as an etch mask, exposing the underlying hardmask layer 104. The hardmask layer is next selectively etched, again using the resist pattern 108b as an etch mask, resulting in patterned BARC and hardmask layers 106', 104', as shown in FIG. 1D. Suitable etching techniques and chemistries for etching the BARC layer and hardmask layer are known in the art and will depend, for example, on the particular materials of these layers. Dry-etching processes such as reactive ion etching are typical. The resist pattern 108b and patterned BARC layer 106' are next removed from the substrate using known techniques, for example, oxygen plasma ashing.

Figure 1E:
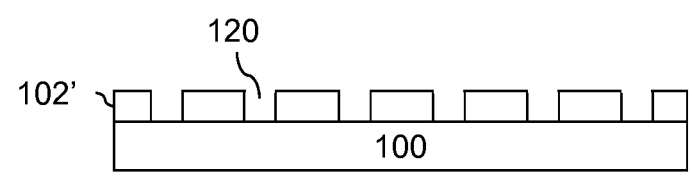

Using the hardmask pattern 104' as an etch mask, the one or more layers 102 are selectively etched. Suitable etching techniques and chemistries for etching the underlying layers 102 are known in the art, with dry-etching processes such as reactive ion etching being typical. The patterned hardmask layer 104' can next be removed from the substrate surface using known techniques, for example, a dry-etching process such as reactive ion etching. The resulting structure is a pattern of etched features 102' as illustrated in FIG. 1E. In an alternative exemplary method, it may be desirable to pattern the layer 102 directly using the resist pattern 108b without the use of a hardmask layer 104. Whether direct patterning is employed will depend on factors such as the materials involved, resist selectivity, resist pattern thickness and pattern dimensions.

The negative tone development methods of the invention are not limited to the exemplary methods described above. For example, the photoresist compositions of the invention can be used in a negative tone development double exposure method for making contact holes. An exemplary such process is a variation of the technique described with reference to FIG. 1, but using an additional exposure of the photoresist layer in a different pattern than the first exposure. In this process, the photoresist layer is exposed to actinic radiation through a photomask in a first exposure step. The photomask includes a series of parallel lines forming the opaque regions of the mask. Following the first exposure, a second exposure of the photoresist layer is conducted through a second photomask that includes a series of lines in a direction perpendicular to those of the first photomask. The resulting photoresist layer includes unexposed regions, once-exposed regions and twice-exposed regions. Following the second exposure, the photoresist layer is post-exposure baked and developed using a developer as described above. Unexposed regions corresponding to points of intersection of the lines of the two masks are removed, leaving behind the once- and twice-exposed regions of the resist. The resulting structure can next be patterned as described above with reference to FIG. 1. This method is particularly suited to formation of contact holes in the manufacture of electronic devices.

The developer compositions of the invention can be used in forming lithographic patterns by NTD in a plurality of photoresist layers during manufacture of the electronic device. For example, a first photoresist pattern formed by NTD can be transferred to one or more layer underlying the photoresist pattern by an etching process. One or more additional layer to be patterned can subsequently be formed and a second resist pattern formed by NTD over the layer to be patterned. The developer compositions used to form the first and second resist patterns can be the same or different. Optionally, the compositions can include the same organic solvents but in different ratios. In this way, development can be optimized for different photoresists and/or different feature dimensions/ geometries. It may be desirable to use the same photoresist composition in forming the different resist patterns, in which case the same organic solvents in the same or different ratios can be used in the developers.

EXAMPLES

Matrix Polymer Synthesis

The following monomers were employed in the syntheses of copolymers in the examples below:

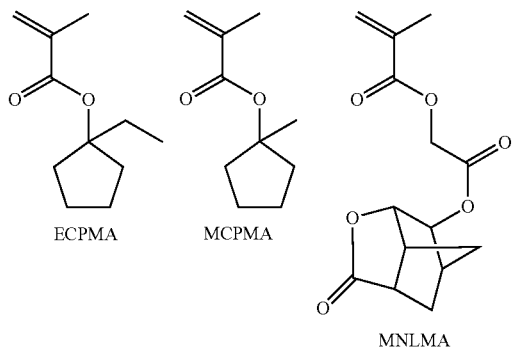

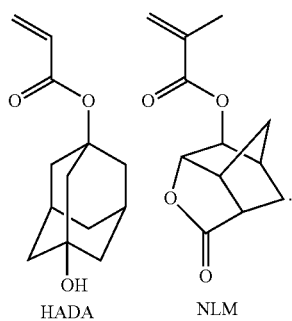

Synthesis of poly(ECPMA/MCPMA/MNLMA/HADA)

Monomers of ECPMA (5.092 g), MCPMA (10.967 g), MNLMA (15.661 g) and HADA (8.280 g) were dissolved in 60 g of propylene glycol monomethyl ether acetate (PG-MEA). The monomer solution was degassed by bubbling with nitrogen for 20 min. PGMEA (27.335 g) was charged into a 500 mL three-neck flask equipped with a condenser and a mechanical stirrer and was degassed by bubbling with nitrogen for 20 min. Subsequently the solvent in the reaction flask was brought to a temperature of 80° C. V601 (dimethyl-2,2-azodiisobutyrate) (0.858 g) was dissolved in 8 g of PGMEA and the initiator solution was degassed by bubbling with nitrogen for 20 min. The initiator solution was added into the reaction flask and then monomer solution was fed into the reactor dropwise over a 3 h period under rigorous stirring and nitrogen environment. After monomer feeding was complete, the polymerization mixture was left standing for an additional hour at 80° C. After a total of 4 h of polymerization time (3 h of feeding and 1 h of post-feeding stirring), the polymerization mixture was allowed to cool down to room temperature. Precipitation was carried out in methyl tert-butyl ether (MTBE) (1634 g). The precipitated polymer was collected by filtration, air-dried overnight, re-dissolved in 120 g of THF, and re-precipitated into MTBE (1634 g). The final polymer was filtered, air-dried overnight and further dried under vacuum at 60° C. for 48 hours to give the following "Polymer A" (Mw: 20,120 and PDI: 1.59)

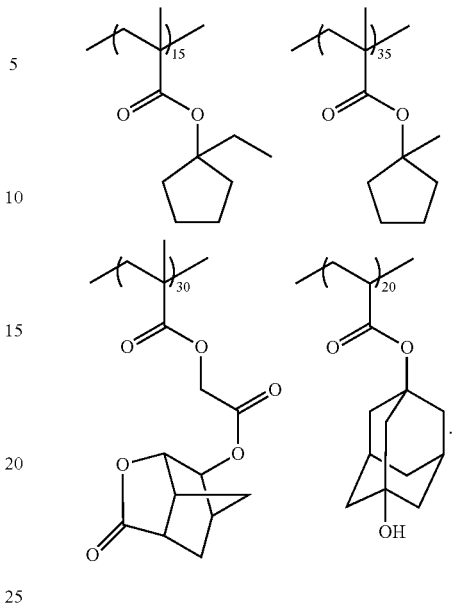

Synthesis of Poly(MCPMA/NLM)

Monomers of MCPMA (17.234 g) and NLM (22.766 g) were dissolved in 60 g of PGMEA. The monomer solution was degassed by bubbling with nitrogen for 20 min. PGMEA (31.938 g) was charged into a 500 mL three-neck flask equipped with a condenser and a mechanical stirrer and was degassed by bubbling with nitrogen for 20 min. Subsequently the solvent in the reaction flask was brought to a temperature of 80° C. V601 (2.831 g) was dissolved in 8 g of PGMEA and the initiator solution was degassed by bubbling with nitrogen for 20 min. The initiator solution was added into the reaction flask and then monomer solution was fed into the reactor dropwise over a 3 h period under rigorous stirring and nitrogen environment. After monomer feeding was complete, the polymerization mixture was left standing for an additional hour at 80° C. After a total of 4 h of polymerization time (3 h of feeding and 1 h of post-feeding stirring), the polymerization mixture was allowed to cool to room temperature. Precipitation was carried out in MTBE (1713 g). The precipitated polymer was collected by filtration, air-dried overnight, re-dissolved in 120 g of THF, and re-precipitated into MTBE (1713 g). The final polymer was filtered, air-dried overnight and further dried under vacuum at 60° C. for 48 h to give the following "Polymer B" (Mw: 8,060 and PDI: 1.46)

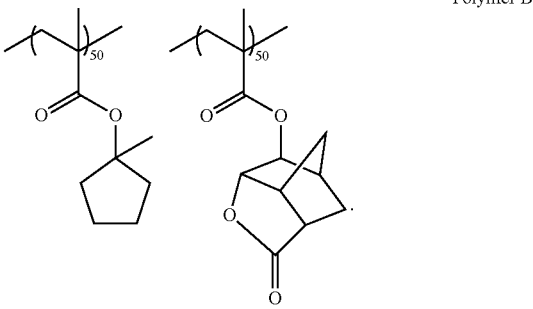

Additive Polymer Synthesis: Poly(n-Butyl Methacrylate) (PnBMA)

40 g of n-butyl methacrylate was dissolved in 60 g of PGMEA. The monomer solution was degassed by bubbling with nitrogen for 20 min. PGMEA (35.913 g) was charged into a 500 mL three-neck flask equipped with a condenser and a mechanical stirrer and was degassed by bubbling with nitrogen for 20 min. Subsequently, the solvent in the reaction flask was brought to a temperature of 80° C. V601 (1.295 g) was dissolved in 8 g of PGMEA and the initiator solution was degassed by bubbling with nitrogen for 20 min. The initiator solution was added into the reaction flask and then monomer solution was fed into the reactor dropwise over a 3 h period under rigorous stirring and nitrogen environment. After monomer feeding was complete, the polymerization mixture was left standing for an additional hour at 80° C. After a total of 4 h of polymerization time (3 h of feeding and 1 hour of post-feeding stirring), the polymerization mixture was allowed to cool to room temperature. Precipitation was carried out in a methanol/water (8/2) mixture (1781 g). The precipitated polymer was collected by filtration, re-dissolved in 120 g of THF, and re-precipitated into methanol/water (8/2) mixture (1781 g). The final polymer was filtered and dried under vacuum at 60° C. for 48 hours to give 31.5 g of PnBMA (Mw=17,600 and Mw/Mn=1.80).

Photoresist Composition A 6.315 g of Polymer A and 6.315 g of Polymer B were dissolved in 145.35 g of PGMEA, 96.90 g of cyclohexanone and 242.25 g of methyl-2-hydroxyisobutyrate. To this mixture was added 2.418 g of "PAG A" described below, 0.143 g of 1-(tert-butoxycarbonyl)-4-hydroxypiperidine and 0.31 g of PnBMA. The resulting mixture was rolled on a roller for 3 h and then filtered through a Teflon filter having a 0.2 micron pore size.

PAG A

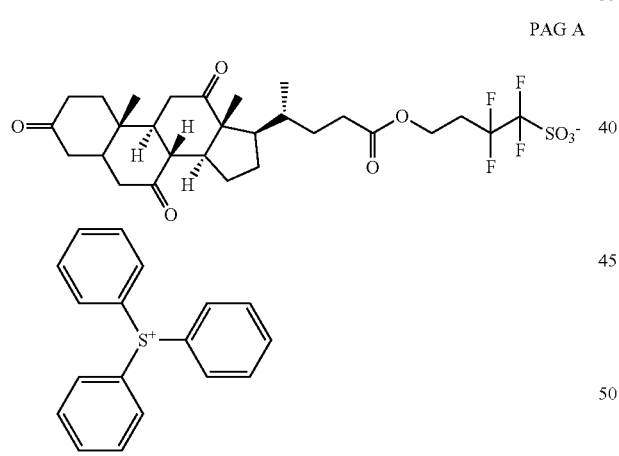

Solvent Structures

The following solvents were employed as a single solvent developer or in a binary mixed developer in negative tone development:

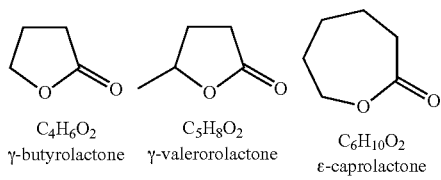

$C_4H_6O_2$
γ-butyrolactone $C_5H_8O_2$
γ-valerorolactone $C_6H_{10}O_2$
ε-caprolactone

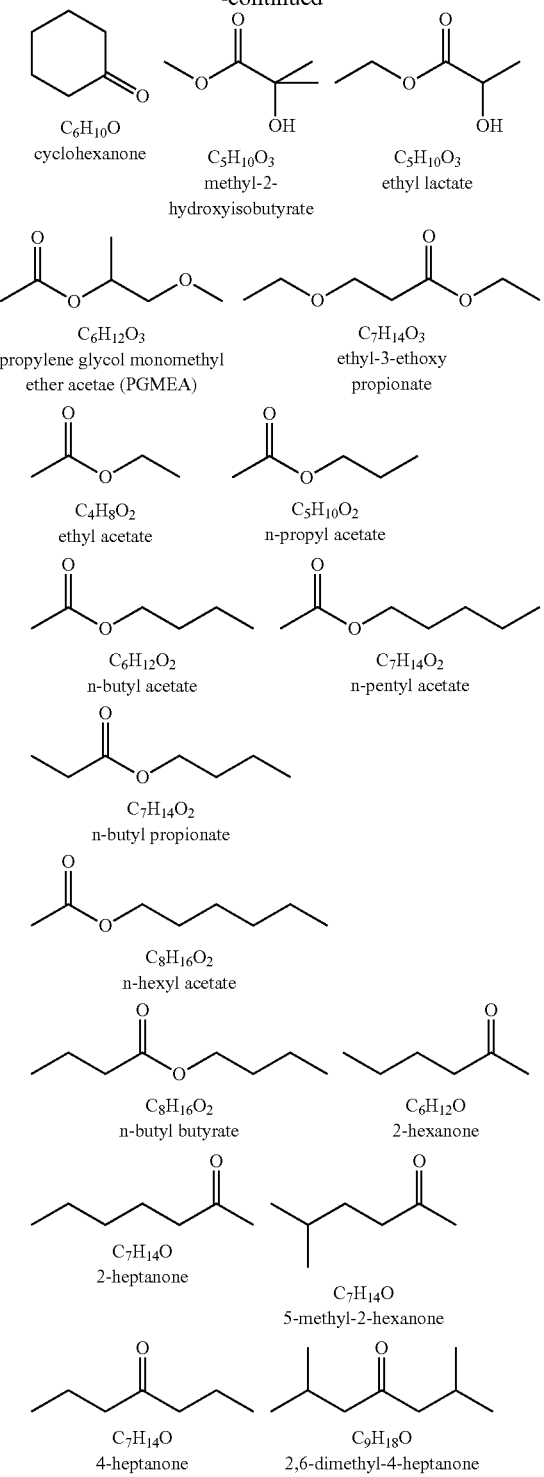

Dry Lithographic Process and Negative Tone Contrast Evaluation

Dry lithographic processing was carried out to examine the NTD contrast of a 193 nm immersion resist with different solvent developers on 200 mm silicon wafers using a TEL CleanTrack ACT 8 linked to an ASML/1100 scanner with a maximum numerical aperture (NA) of 0.75. Silicon wafers were spin-coated with AR™ 77 bottom-antireflective coating (BARC) material (Rohm and Haas Electronic Materials) and baked for 60 seconds at 205° C. to yield a film thickness of 840 Å. Photoresist Composition A was coated on the BARC-coated wafers and soft-baked at 90° C. for 60 seconds on a TEL CleanTrack ACT 8 coater/developer to provide a resist layer thickness of 900 Å.

The photoresist-coated wafers were then exposed through a blank mask using 0.75 NA and a Quadrapole 30 illumination condition with 0.89 outer sigma and 0.64 inner sigma. The exposure was carried out with a starting dose of 1.0 mJ/cm$^2$ in increments of 0.4 mJ/cm$^2$ to expose 100 dies in a 10×10 array on the wafer in a dose range from 1.0 to 40.6 mJ/cm$^2$. The exposed wafers were post-exposure baked at 90° C. for 60 seconds and then each developed using a different organic solvent developer for 10 seconds on a TEL CleanTrack ACT 8 coater/developer. The remaining film thickness after development for the different exposure doses was measured on a ThermaWave Optiprobe (KLA-Tencor) and NTD contrast curves were generated by plotting remaining film thickness as a function of exposure energy. From the contrast curves, threshold energy ($E_{th}$) for each developer was determined as the minimum energy to reach constant film thickness. This value was used as a measure of photo-sensitivity of the resist in the NTD process.

Examples 1-20

Lithographic Examples 1-20 were carried out using various organic solvents containing, for example, ester, ketone, alcohol and ether functional groups as a developer. The developers, $E_{th}$ and resist thicknesses at $E_{th}$ and at doses of 3 mJ/cm$^2$ and 33 mJ/cm$^2$ are shown in Table 1.

TABLE 1

| Ex. | NTD Developer | $E_{th}$ (mJ/cm$^2$) | Thickness at 3 mJ/cm$^2$ (Å) | Thickness at 33 mJ/cm$^2$ (Å) | Thickness at $E_{th}$ (Å) | (%) |
|---|---|---|---|---|---|---|
| 1 | γ-butyrolactone | N/A* | 58 | 35 | N/A* | N/A* |
| 2 | γ-valerolactone | N/A* | 30 | 49 | N/A* | N/A* |
| 3 | ε-caprolactone | N/A* | N/A** | N/A** | N/A* | N/A* |
| 4 | cyclohexanone | N/A* | 34 | 89 | N/A* | N/A* |
| 5 | methyl-2-hydroxyisobutyrate | N/A* | 45 | 75 | N/A* | N/A* |
| 6 | ethyl lactate | N/A* | 28 | 16 | N/A* | N/A* |
| 7 | PGMEA | N/A* | 0 | 468 | N/A* | N/A* |
| 8 | ethyl-3-ethoxy propionate | 18.6 | 48 | 725 | 725 | 81 |
| 9 | ethyl acetate | 28.2 | 0 | 647 | 640 | 71 |
| 10 | n-propyl acetate | 16.2 | 0 | 766 | 750 | 83 |
| 11 | n-butyl acetate | 9 | 63 | 768 | 781 | 87 |
| 12 | n-pentyl acetate | N/A* | 533 | 819 | N/A* | N/A* |
| 13 | n-butyl propionate | N/A* | 763 | 818 | N/A* | N/A* |
| 14 | n-hexyl acetate | N/A* | 811 | 789 | N/A* | N/A* |
| 15 | n-butyl butyrate | N/A* | 852 | 779 | N/A* | N/A* |
| 16 | 2-hexanone | N/A* | 3 | 530 | N/A* | N/A* |
| 17 | 2-heptanone | 26.2 | 9 | 709 | 710 | 79 |
| 18 | 5-methyl-2-hexanone | 20.2 | 3 | 738 | 740 | 82 |
| 19 | 4-heptanone | 20.2 | 27 | 774 | 770 | 86 |
| 20 | 2,6-dimethyl-4-heptanone | N/A* | 867 | 783 | N/A* | N/A* |

Figure 2:
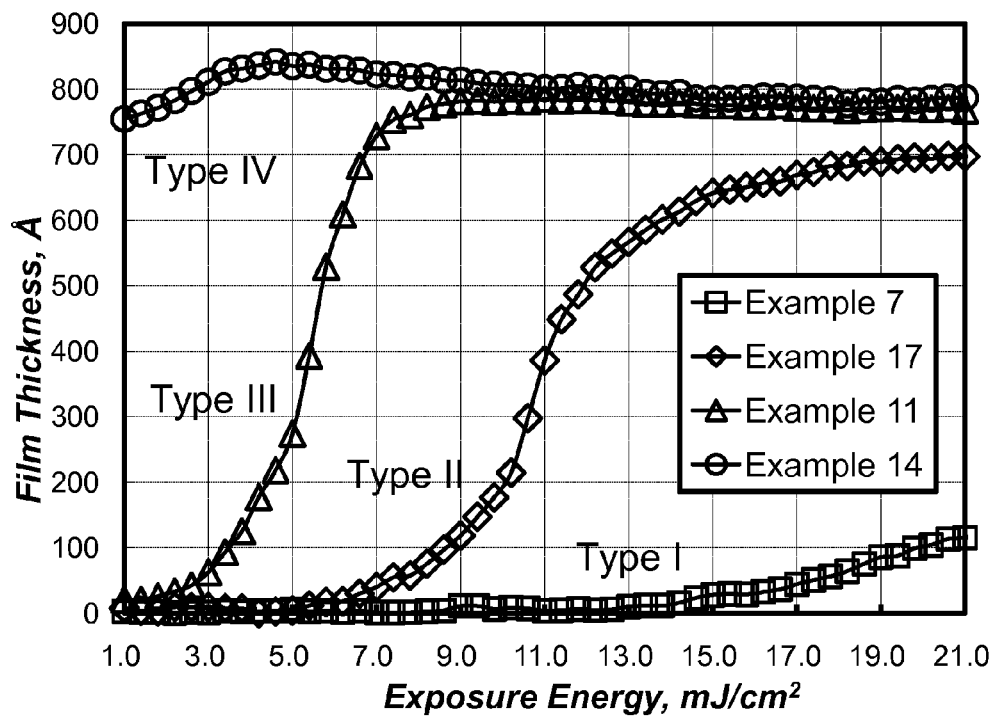
FIGS. 2-3 are contrast curves for photoresist compositions treated with various developer compositions described in the examples.

*$E_{th}$ was not observed under 40.6 mJ/cm$^2$
**No thickness measurement due to incomplete evaporation of the solvent As shown in FIG. 2 and as discussed above, Example 7 (PGMEA) was found to exhibit typical Type I NTD behavior, Example 17 (2-heptanone) was found to exhibit typical Type II NTD behavior, Example 11 (n-butyl acetate) was found to exhibit typical Type III NTD behavior and Example 14 (n-hexyl acetate) was found to exhibit typical Type IV NTD behavior with Photoresist Composition A. It was found that $C_4$-$C_6$ cyclic esters or ketones (Examples 1-4), $C_5$ hydroxyl alkyl esters (Examples 5-6) and $C_6$ alkoxy alkyl acetate (Example 7) exhibit Type I NTD behavior under given conditions with Photoresist Composition A. Even with an exposure energy of 33 mJ/cm$^2$, only nominal thickness retention was observed using four cyclic organic solvents and hydroxyl alkyl esters as a developer. It was difficult to remove residual ε-caprolactone by simply rotating the wafer on the track after development and this is believed to have resulted in an inaccurate thickness measurement. This may indicate that cyclic esters or ketones higher than $C_6$ may not be applicable to the NTD process as a developer due to their slow rates of evaporation.

Among seven alkyl esters tested as a developer (Examples 9-15), only n-propyl acetate and n-butyl acetate resulted in good NTD contrasts (Examples 10 and 11, respectively) and alkyl esters with higher than $C_6$ did not yield any NTD contrasts (Examples 12-15). It was found that alkyl esters higher than $C_6$ exhibited poor dissolution power in the exposed areas even at very low doses and Type IV NTD behavior was observed with these solvents (Examples 12-15). Although not as significant as other higher alkyl esters, n-butyl acetate exhibited detectable residual film thickness of 63 Å after exposure at low dose (Example 11), where complete resist removal is desirable. Therefore, Type III NTD behavior can be used to describe the NTD contrast obtained with n-butyl acetate. Whereas ethyl acetate exhibited Type II NTD behavior (Example 9), n-propyl acetate exhibited a very good NTD contrast between Type II and III, completely removing areas exposed at low energy and retaining good film thickness in the areas exposed at high energy (Example 10).

Five alkyl ketones tested (Examples 16-20) exhibited very different results depending on the number of carbon atoms and the position of the oxygen atom in the alkyl chains. While terminal $C_7$ alkyl ketones such as 2-heptanone and 5-methyl-2-hexanone (Examples 17 and 18, respectively) exhibited Type III NTD behavior, 4-heptanone exhibited detectable amounts of thickness (~30 Å) when exposed at low dose (Example 19). 2,6-Dimethyl-4-heptanone ($C_9$ alkyl ketone, Example 20) exhibited Type IV NTD behavior with very similar thickness changes as a function of exposure energy as alkyl esters higher than $C_6$ (Examples 12-15). No $E_{th}$ value was observed using 2,6-dimethyl-4-heptanone as a developer and, as shown in Table 1, a higher residual thickness was observed at low exposure dose than at higher exposure dose. This can be explained by the loss of leaving groups at higher exposure energy. Using terminal $C_7$ ketones as in Examples 17 and 18 as a developer, the resist film can be completely removed at low exposure dose, with residual film thickness being less than 1.0 nm at 3 mJ/cm$^2$. This is believed to indicate that terminal ketones are more effective at removing unexposed areas of the resist film than esters or ketones having a ketone group at the center position.

Esters with an alkoxy or a hydroxy functional group were also tested as a developer (Examples 5-8). When esters with a hydroxyl group were used as a developer (Examples 5 and 6), Type I NTD behavior was observed with no NTD contrast, and even with an exposure energy of 33 mJ/cm$^2$, only nominal thickness retention (less than 10 nm) was observed using ethyl lactate or methyl-2-hydroxyisobutyrate as a developer. When alkoxy alkyl esters were used as a developer (Examples 7 and 8), very different results were obtained depending on the number of carbon atoms and the chemical structures. While the $C_6$ alkoxy ester (Example 7) exhibited Type I NTD behavior, good NTD contrast was observed with the $C_7$ alkoxy propionate of Example 8. Due to the measurable residual thickness at lower exposure energy (i.e., ~50 Å at 3 mJ/cm$^2$), the NTD contrast obtained in Example 8 seems to be closer to Type III than Type II NTD behavior.

It appears that only certain organic solvents can be used as a developer in the NTD process with 193 nm photoresists. In general, cyclic lactones and ketones may not be a good developer in the NTD process, since these solvents dissolves both exposed and unexposed areas without NTD contrasts. Only limited alkyl esters can be used as a developer in the NTD process. Alkyl esters with higher than C$_6$ may not work as a good NTD developer since they are relatively poor solvents even for a partially deprotected resist film at lower exposure doses. Alkyl acetates with lower than C$_7$ may work as a developer in the NTD process, but their flammability may not be desirable for the safety reasons. Although a flammable C$_6$ alkyl acetate, n-butyl acetate, exhibits a good NTD contrast, its incomplete dissolution of partially deprotected areas (or areas exposed at a lower doses) may cause defects such as micro-bridging or missing contact holes in the imaging process. Without consideration of its flammability, C$_5$ alkyl acetate, n-propyl acetates, seems to be best suited as a solvent developer in the NTD process.

Combining alkyl esters with a hydroxy group may not be a good strategy for a solvent developer since the fully exposed areas are still soluble in the resulting solvents. Combining alkyl esters with an alkoxy group seems be a viable way to obtain good NTD contrasts depending on the number of carbons and chemical structures. While propylene glycol monomethyl ether acetate (PGMEA, C$_6$ alkyl ester combined with methyl ether) shows a poor NTD contrast, ethyl-3-ethoxy propionate (C$_7$ alkyl propionate combined with ethyl ether) exhibited a good NTD contrast.

C$_7$ alkyl ketones exhibit good NTD contrasts with complete removal of exposed areas under lower doses. In contrast, the C$_9$ alkyl ketone tested as an example did not work as a good NTD developer for the same reason as alkyl esters with higher than C$_6$. The terminal C$_6$ alkyl ketone seems to show NTD behavior closer to Type I with severe thickness loss even after exposure at higher energy.

Examples 21-25

Figure 3:
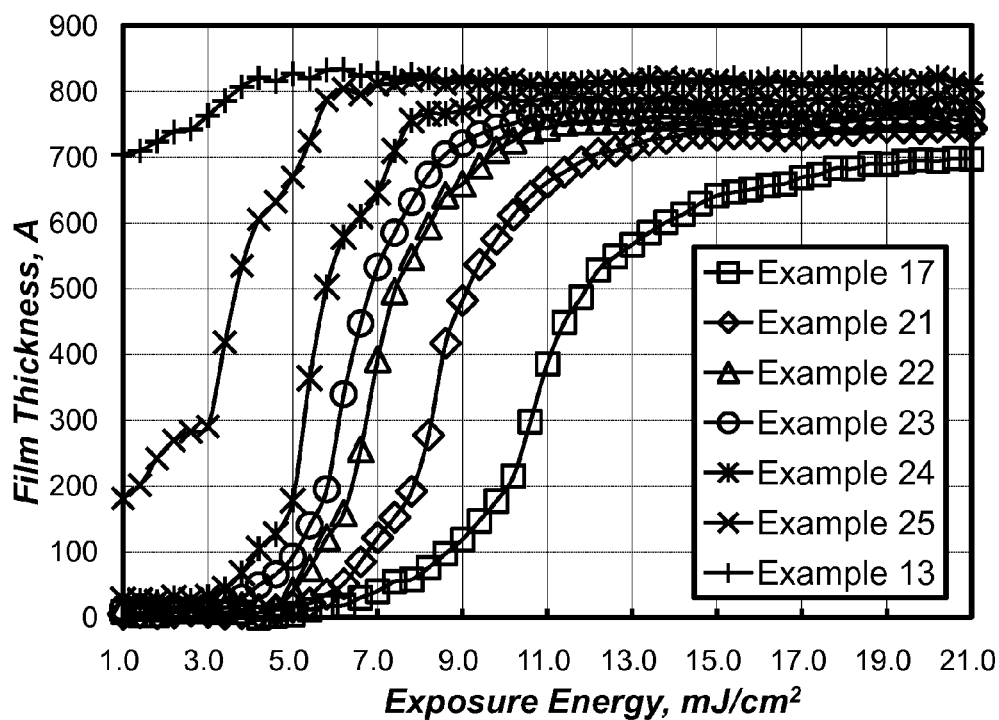

Although terminal C$_7$ alkyl ketones (Examples 17 and 18) exhibit effective removal of exposed areas under low exposure energy, their relatively slower photospeeds and greater thickness loss compared to Type III NTD developer (Example 11) may not be desirable. In order to improve photo-sensitivity and film retention with 2-heptanone (Example 17), binary solvent mixtures were prepared by mixing 2-heptanone with n-butyl propionate which exhibited Type IV NTD behavior (Example 13). A summary of the results is shown in Table 2, and NTD contrast curves for Examples 21-25 in comparison with Examples 13 and 17 are shown in FIG. 3. It was found that the photospeeds for 2-heptanone can be enhanced linearly as a function of the weight percentage of n-butyl propionate in the mixture for the range of 20-80 wt %. It was also found that the residual film thickness after exposure at 3 mJ/cm$^2$ was less than 5 nm with Examples 21-24 where the binary solvent developer contained 20-60 wt % of n-butyl propionate. The residual thickness data at 3 and 33 mJ/cm$^2$ did not indicate a linear relationship. Even with 20% of n-butyl propionate, Example 21 indicates very good film retention after exposure at 33 mJ/cm$^2$ and even with 60 wt % n-butyl propionate, Example 24 exhibits very good resist removal capability after exposure 3 mJ/cm$^2$. It is believed that a synergy in both resist removal at lower exposure dose and film retention at higher exposure dose makes blending solvents with Type III or IV NTD behavior and solvents with Type I or II NTD behavior a viable way to produce a developer very suitable for the NTD process. In addition, photospeeds can be effectively tailored as shown with mixtures of 2-heptanone and n-butyl propionate as a developer without difficulties in removing a resist film exposed under low exposure energy.

TABLE 2

| NTD Developer Composition | | | | | | |
|---|---|---|---|---|---|---|
| 2-heptanone | n-butyl propionate | $E_{th}$ | Thickness at 3 mJ/cm$^2$ | Thickness at 33 mJ/cm$^2$ | Thickness at $E_{th}$ | |
| Ex. (wt %) | (wt %) | (mJ/cm$^2$) | (Å) | (Å) | (Å) | (%) |
| 17   100 | 0 | 26.2 | 9 | 709 | 710 | 79 |
| 21   80 | 20 | 14.6 | 8 | 744 | 736 | 81 |
| 22   60 | 40 | 12.6 | 15 | 753 | 754 | 83 |
| 23   50 | 50 | 11 | 16 | 765 | 762 | 85 |
| 24   40 | 60 | 9.8 | 32 | 787 | 791 | 88 |
| 25   20 | 80 | 7 | 290 | 812 | 810 | 90 |
| 13   0 | 100 | N/A* | 763 | 818 | N/A | N/A |

*$E_{th}$ was not calculated due to the absence of the NTD contrast

This binary solvent NTD developer concept was extended to other pairs of solvents of Type I or II behavior with Type III or IV behavior as described in Tables 3-8. The data indicates that by selection of appropriate solvent ratios, synergies can be achieved for removing areas exposed at low exposure dose while retaining significant film thickness in areas exposed at high exposure dose.

TABLE 3

| NTD Developer Composition | | | | | | |
|---|---|---|---|---|---|---|
| γ-butyrolactone, | n-butyl propionate | $E_{th}$ | Thickness at 3 mJ/cm$^2$ | Thickness at 33 mJ/cm$^2$ | Thickness at $E_{th}$ | |
| Ex. (wt %) | (wt %) | (mJ/cm$^2$) | (Å) | (Å) | (Å) | (%) |
| 26   25 | 75 | N/A* | 11.3 | 398 | N/A | N/A |
| 27   50 | 50 | N/A* | 31.1 | 42.7 | N/A | N/A |
| 28   75 | 25 | N/A* | 56.5 | 39.8 | N/A | N/A |

*$E_{th}$ was not calculated due to the absence of the NTD contrast

TABLE 4

| Ex. | NTD Developer Composition cyclohexanone (wt %) | n-butyl propionate (wt %) | $E_{th}$ (mJ/cm$^2$) | Thickness at 3 mJ/cm$^2$ (Å) | Thickness at 33 mJ/cm$^2$ (Å) | Thickness at $E_{th}$ (Å) | (%) |
|---|---|---|---|---|---|---|---|
| 29 | 25 | 75 | 21.0 | 0.0 | 762.6 | 760.1 | 84.5 |
| 30 | 50 | 50 | N/A* | 9.5 | 230.6 | N/A | N/A |
| 31 | 75 | 25 | N/A* | 10.3 | 12.2 | N/A | N/A |

*$E_{th}$ was not calculated due to the absence of the NTD contrast

TABLE 5

| Ex. | NTD Developer Composition PGMEA (wt %) | n-butyl propionate (wt %) | $E_{th}$ (mJ/cm$^2$) | Thickness at 3 mJ/cm$^2$ (Å) | Thickness at 33 mJ/cm$^2$ (Å) | Thickness at $E_{th}$ (Å) | (%) |
|---|---|---|---|---|---|---|---|
| 32 | 25 | 75 | 9.0 | 112.7 | 785.84 | 791.8 | 88.0 |
| 33 | 50 | 50 | 21.0 | 9.2 | 753.9 | 747.6 | 83.0 |
| 34 | 75 | 25 | N/A* | 0.0 | 649.9 | N/A | N/A |

*$E_{th}$ was not calculated due to the absence of the NTD contrast

TABLE 6

| Ex. | NTD Developer Composition 5-methyl-2-hexanone (wt %) | n-butyl propionate (wt %) | $E_{th}$ (mJ/cm$^2$) | Thickness at 3 mJ/cm$^2$ (Å) | Thickness at 33 mJ/cm$^2$ (Å) | Thickness at $E_{th}$ (Å) | (%) |
|---|---|---|---|---|---|---|---|
| 35 | 25 | 75 | 8.6 | 98.4 | 782.1 | 790.2 | 87.8 |
| 36 | 50 | 50 | 12.6 | 12.0 | 765.7 | 762.9 | 84.8 |
| 37 | 75 | 25 | 19.4 | 0.5 | 739.5 | 732.5 | 81.4 |

TABLE 7

| Ex. | NTD Developer Composition 2-heptanone (wt %) | 2,6-dimethyl-4-heptanone (wt %) | $E_{th}$ (mJ/cm$^2$) | Thickness at 3 mJ/cm$^2$ (Å) | Thickness at 33 mJ/cm$^2$ (Å) | Thickness at $E_{th}$ (Å) | (%) |
|---|---|---|---|---|---|---|---|
| 38 | 25 | 75 | N/A* | 699.2 | 792.3 | N/A | N/A |
| 39 | 50 | 50 | 8.6 | 62.0 | 773.7 | 772.1 | 85.8 |
| 40 | 75 | 25 | 16.2 | 10.3 | 750.0 | 746.0 | 82.9 |

*$E_{th}$ was not calculated due to the absence of the NTD contrast

TABLE 8

| Ex. | NTD Developer Composition 2-heptanone (wt %) | n-butyl acetate (wt %) | $E_{th}$ (mJ/cm$^2$) | Thickness at 3 mJ/cm$^2$ (Å) | Thickness at 33 mJ/cm$^2$ (Å) | Thickness at $E_{th}$ (Å) | (%) |
|---|---|---|---|---|---|---|---|
| 41 | 25 | 75 | 19.4 | 0.0 | 752.5 | 749.5 | 83.3 |
| 42 | 50 | 50 | 21.0 | 0.0 | 734.8 | 735.4 | 81.7 |
| 43 | 75 | 25 | 28.2 | 0.0 | 712 | 714.2 | 79.4 |

Immersion Lithographic Process 300 mm silicon wafers were spin-coated with AR™ 40A antireflectant (Rohm and Haas Electronic Materials) to form a first BARC layer on a TEL CLEAN TRAC LITHIUS i+ coater/developer. The wafer was baked for 60 seconds at 215° C., yielding a first BARC film with a thickness of 840 Å. A second BARC layer was next coated over the first BARC using AR™ 124 antireflectant (Rohm and Haas Electronic Materials), and was baked at 205° C. for 60 seconds to generate a 200 Å top BARC layer. Photoresist Composition A was then coated on the dual BARC-coated wafers and softbaked at 90° C. for 60 seconds on a TEL CLEAN TRACK LITHIUS i+ coater/developer to provide a resist layer with a thickness of 900 Å.

The photoresist-coated wafers were exposed through a mask on an ASML TWINSCAN XT:1900i immersion scanner using three different exposure conditions. Two different single exposure processes were carried out through a mask having post patterns to print hole patterns using two different illumination conditions: 1. Annular illumination with 1.35 NA, 0.9 outer sigma, 0.7 inner sigma and XY polarization and 2. Crossed sectoral quadruple (C-Quad) illumination with 1.35 NA, 0.9 outer sigma, 0.7 inner sigma and XY polarization. The third exposure condition involved double exposure of line/space patterns. The line/space pattern of the photomask used for the second exposure was oriented in a direction perpendicular to that of the photomask used in the first exposure for printing contact hole images. The first exposure was carried out using a dipole illumination with 1.35 NA, 0.97 outer sigma, 0.82 inner sigma and X polarization Immediately following the first exposure, the wafers were exposed again using a dipole illumination with 1.35 NA, 0.97 outer sigma, 0.82 inner sigma and Y polarization.

The exposed wafers were post-exposure baked at 90° C. for 60 seconds and then developed using an organic solvent developer for 25 seconds on a TEL CLEAN TRACK™ LITHIUS™ i+ coater/developer to give negative tone patterns. Optimum energy ($E_{op}$) to print 45 nm holes was determined for the single exposure NTD process by plotting the critical dimension (CD) values, measured on a Hitachi CG4000 CD SEM, as a function of exposure energy using a mask CD at 60 nm (the diameter of an opaque post on the mask) and a pitch CD at 90 nm (a mask CD plus the distance between opaque posts). Local CD uniformity (CDU) of 45 nm holes was measured as a 3σ of 240 CD values. For each wafer, 20 images were taken per die and 12 contact hole measurements per image were taken at 250K magnification. For the double exposure NTD process, $E_{op}$ to print 38 or 40 nm holes was calculated by plotting the CD values of contact holes as a function of exposure energy using a mask with 38 or 40 nm 1:1 line/space CD. CDU of 38 or 40 nm contact holes was measured as a 3σ of 270 CD values. For each wafer, 30 images per die and 9 contact hole measurements per image were taken at 250K magnification.

Exposure latitude (EL) of a photoresist is defined by the CD change (ΔCD) per exposure energy (mJ/cm²) within ±10% of a target CD ($CD_t$). A minimum ΔCD with a change in exposure dose is a desirable property of photoresists. It was found that different NTD developers give different EL values for a given photoresists and EL values were calculated for different solvent developer systems according to the following formula:

$$EL=(1.1 \times CD_t - 0.9 \times CD_t)/(E_{op} \text{ of } 1.1 \times CD_t - E_{op} \text{ of } 0.9 \times CD_t)$$

Examples 44-54

Figure 4:
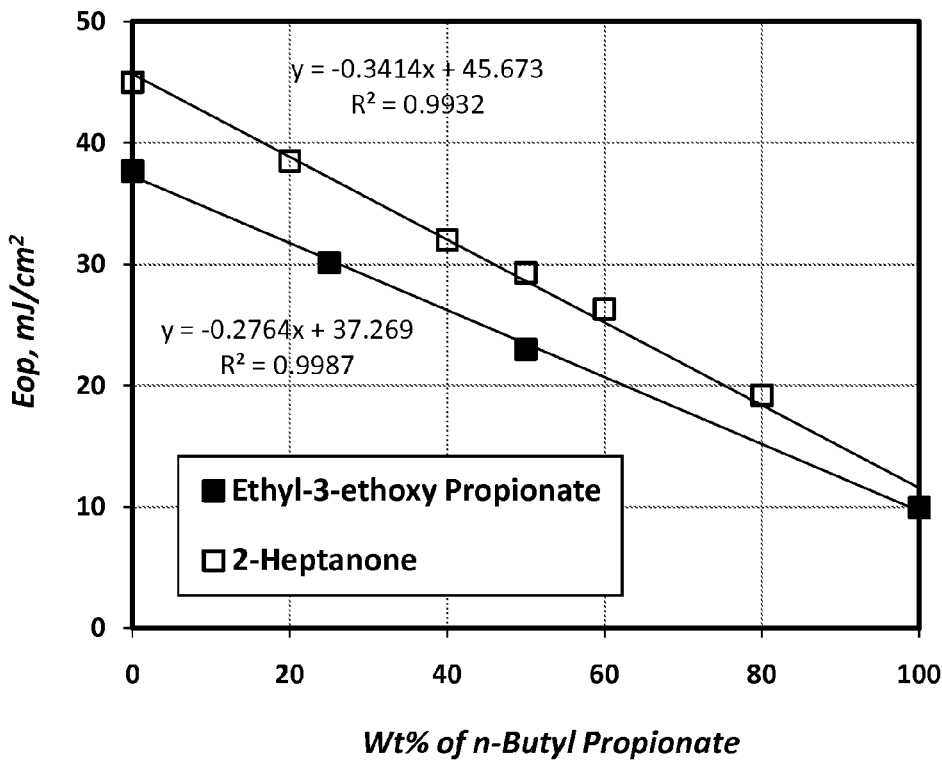
FIG. 4 is a graph showing optimum energy for printing contact hole patterns as a function of developer composition.

The development performance of various binary solvent mixtures was tested for mixtures of ethyl-3-ethoxy propionate or 2-heptanone with n-butyl propionate. Tables 9 and 10 summarize the double exposure NTD results of 38 nm contact holes at 76 nm pitch developed with various ethyl-3-ethoxy propionate/n-butyl propionate or 2-heptanone/n-butyl propionate developer blends, respectively. FIG. 4 shows $E_{op}$ as a function of developer composition for these contact holes based on the data in Table 9 and 10. This data indicates that $E_{op}$ can be controlled linearly as a function of ethyl-3-ethoxy propionate or 2-heptanone content in n-butyl propionate. In terms of lithographic performance, the binary n-butyl propionate/ethyl-3-ethoxy propionate developer compositions resulted in deterioration of EL and CDU. With greater than 25 wt % of n-butyl propionate in ethyl-3-ethoxy propionate, more missing contact holes were observed for 38 nm contact holes at 76 nm pitch. With reference to Table 10, improvements for n-butyl propionate/2-heptanone NTD developer compositions were exhibited in both photospeed and CDU over a wide range of n-butyl propionate contents (~20-60 wt %).

TABLE 9

| | NTD Developer Composition | | | | |
|---|---|---|---|---|---|
| Ex. | ethyl-3-ethoxy propionate (wt %) | n-butyl propionate (wt %) | $E_{op}$* (mJ/cm²) | EL (nm/ [mJ/cm²]) | CDU |
| 44 | 100 | 0 | 37.7 | 1.3 | 3.7 |
| 45 | 75 | 25 | 30.1 | 1.5 | 4.0 |
| 46 | 50 | 50 | 23.0 | NA** | NA** |
| 47 | 25 | 75 | NA** | NA** | NA** |
| 48 | 0 | 100 | 9.9 | 2.4 | 5.2 |

*$E_{op}$ of 38 nm contact holes at 76 nm pitch
**Not determined due to missing contact holes

TABLE 10

| | NTD Developer Composition | | | | |
|---|---|---|---|---|---|
| Ex. | 2-heptanone (wt %) | n-butyl propionate | $E_{op}$* (mJ/cm²) | EL (nm/[mJ/cm²]) | CDU |
| 49 | 100 | 0 | 45.0 | 1.0 | 4.15 |
| 50 | 80 | 20 | 38.5 | 1.2 | 3.58 |
| 51 | 60 | 40 | 32.0 | 1.1 | 3.40 |
| 52 | 50 | 50 | 29.3 | 1.4 | 3.29 |
| 53 | 40 | 60 | 26.3 | 1.7 | 3.18 |
| 54 | 20 | 80 | 19.2 | 2.6 | 4.12 |

*$E_{op}$ of 38 nm contact holes at 76 nm pitch

Examples 55-68

Figure 5:
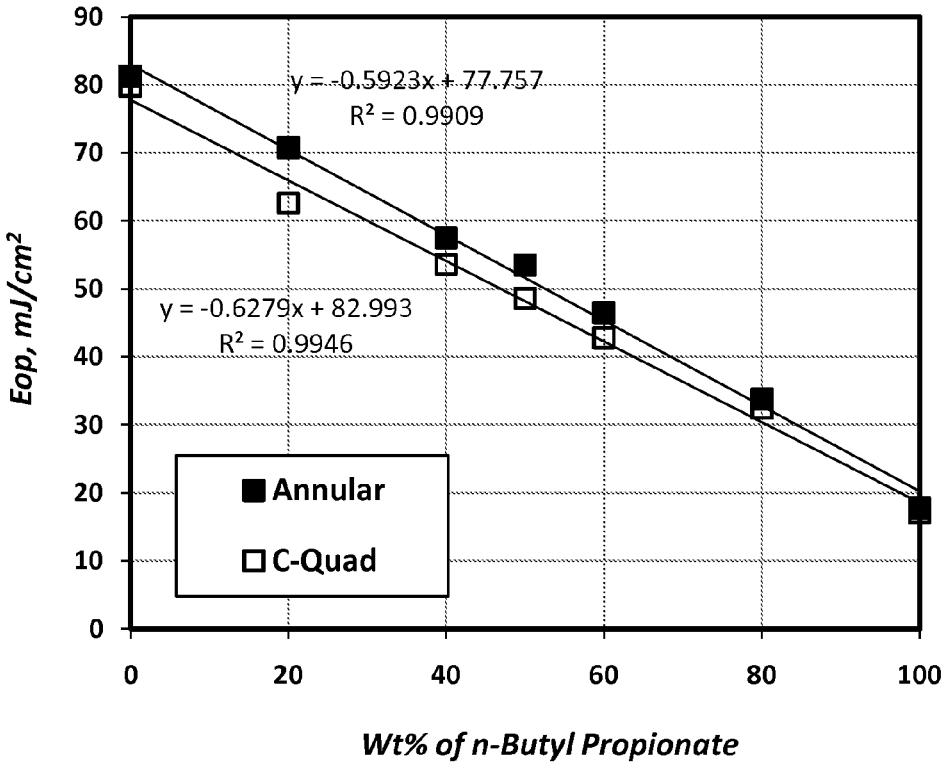
FIG. 5 is a graph showing optimum energy for printing contact hole patterns as a function of developer composition and illumination mode.

Single exposure NTD lithography was carried out using 2-heptanone/n-butyl propionate mixed developers, with the developers and results being summarized in Tables 11 and 12. Examples 55-61 (Table 11) were exposed under annular illumination and Examples 62-68 (Table 12) were exposed under C-Quad illumination. As shown in FIG. 5, it was found that $E_{op}$ can be controlled linearly in both cases as a function of n-butyl propionate content in 2-heptanone. As $E_{op}$ decreased with increased n-butyl propionate in the developer, EL tended to worsen but not significantly until n-butyl propionate reached 80 wt % in the developer for both illumination conditions.

TABLE 11

| | NTD Developer Composition | | | | |
|---|---|---|---|---|---|
| Ex. | 2-heptanone (wt %) | n-butyl propionate (wt %) | $E_{op}$* (mJ/cm²) | EL (nm/[mJ/cm²]) | CDU |
| 55 | 100 | 0 | 79.8 | NA | 6.3 |
| 56 | 80 | 20 | 62.6 | 0.7 | 6.6 |
| 57 | 60 | 40 | 53.6 | 1.3 | 5.9 |
| 58 | 50 | 50 | 48.6 | 1.3 | 6.3 |
| 59 | 40 | 60 | 42.8 | 1.6 | 5.9 |
| 60 | 20 | 80 | 32.5 | 3.5 | 6.3 |
| 61 | 0 | 100 | 17.1 | 2.3 | 8.9 |

*$E_{op}$ of 45 nm contact holes at 90 nm pitch

TABLE 12

| | NTD Developer Composition | | | | |
|---|---|---|---|---|---|
| Ex. | 2-heptanone (wt %) | n-butyl propionate (wt %) | $E_{op}$* (mJ/cm²) | EL (nm/[mJ/cm²]) | CDU |
| 62 | 100 | 0 | 81.3 | 0.8 | 4.5 |
| 63 | 80 | 20 | 70.8 | NA | 4.0 |

TABLE 12-continued

| | NTD Developer Composition | | | | |
|---|---|---|---|---|---|
| Ex. | 2-heptanone (wt %) | n-butyl propionate (wt %) | $E_{op}$* (mJ/cm$^2$) | EL (nm/[mJ/cm$^2$]) | CDU |
| 64 | 60 | 40 | 57.5 | 0.8 | 4.4 |
| 65 | 50 | 50 | 53.5 | 0.8 | 4.0 |
| 66 | 40 | 60 | 46.5 | 1.0 | 4.7 |
| 67 | 20 | 80 | 33.8 | 2.1 | 7.6 |
| 68 | 0 | 100 | 17.8 | 1.9 | 6.6 |

*$E_{op}$ of 45 nm contact holes at 90 nm pitch

Single exposure NTD processes generally require high exposure energies compared with double exposure processes. Based on the obtained data, a single exposure NTD process using a 2-heptanone developer typically requires ~80 mJ/cm$^2$ to print 45 nm contact holes at 90 nm pitch (Examples 55 and 62), whereas a double exposure NTD process using the same resist and developer system requires only 45 mJ/cm$^2$ to print even much smaller 38 nm contact holes at 76 nm pitch (Example 49). This would seem to indicate that the resist optimized for the double exposure process cannot effectively be used for a single exposure process for printing CDs of similar sizes due to the extremely slow photospeeds of the single exposure NTD process. Surprisingly, this problem can be solved by varying the ratio of one organic solvent to another in the developer mixture. For example, when the 2-heptanone/n-butyl propionate 40/60 mixture is used as a developer, the $E_{op}$ of 45 nm contact holes at 90 nm pitch can be reduced down to ~45 mJ/cm$^2$ in the single exposure NTD process without losing lithographic performance as demonstrated in Examples 59 and 66.

What is claimed is:

1. A method of forming a photolithographic pattern, comprising:
   (a) providing a substrate comprising one or more layer to be patterned over a surface of the substrate;
   (b) applying a layer of a photoresist composition over the one or more layer to be patterned;
   (c) patternwise exposing the photoresist composition layer to actinic radiation;
   (d) heating the exposed photoresist composition layer in a post-exposure bake process; and
   (e) applying a photoresist developer composition to the post-exposure baked photoresist composition layer to remove unexposed regions of the photoresist composition layer, thereby forming a photoresist pattern, wherein the photoresist developer composition comprises a mixture of a first organic solvent and a second organic solvent that are different from each other, wherein the first organic solvent is 2-heptanone and the second organic solvent is n-butyl propionate.

2. The method of claim 1, further comprising performing a second patternwise exposure of the photoresist composition layer to actinic radiation after the patternwise exposure and before applying the photoresist developer composition.

3. The method of claim 1, further comprising after (e):
   (f) transferring the pattern of the photoresist pattern to one or more layer underlying the photoresist pattern by an etching process;
   (g) forming one or more additional layer to be patterned over the surface of the substrate;
   (h) applying a second layer of a photoresist composition over the one or more additional layer to be patterned;
   (i) patternwise exposing the second photoresist composition layer to actinic radiation;
   (j) heating the exposed second photoresist composition layer in a post-exposure bake process; and
   (h) applying a second photoresist developer composition to the post-exposure baked second photoresist composition layer to remove unexposed regions of the second photoresist composition layer, thereby forming a second photoresist pattern, wherein the second photoresist developer composition comprises the same first organic solvent and second organic solvent as the first photoresist developer composition.

4. The method of claim 3, wherein the ratio of the first organic solvent to the second organic solvent in the first photoresist developer is different from the ratio of the first organic solvent to the second organic solvent in the second photoresist developer.

5. The method of claim 1, wherein the first organic solvent is present in the composition in an amount of from 30 to 70 wt % based on the total developer composition, and the second organic developer is present in the composition in an amount of from 70 to 30 wt % based on the total developer composition.

* * * * *